(12) United States Patent
Sander et al.

(10) Patent No.: US 6,287,953 B1
(45) Date of Patent: *Sep. 11, 2001

(54) MINIMIZING TRANSISTOR SIZE IN INTEGRATED CIRCUITS

(75) Inventors: Craig S. Sander; Rich K. Klein, both of Mountain View; Asim A. Selcuk, Cupertino; Nicholas J. Kepler, San Jose; Christoper A. Spence; Raymond T. Lee, both of Sunnyvale; John C. Holst, San Jose, all of CA (US); Stephen C. Horne, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/515,875

(22) Filed: Feb. 29, 2000

Related U.S. Application Data

(63) Continuation-in-part of application No. 09/119,934, filed on Jul. 21, 1998, now Pat. No. 6,146,954.

(51) Int. Cl.[7] .................................................. H01L 21/336
(52) U.S. Cl. .......................... 438/618; 438/299; 438/301; 438/303; 438/305; 438/233; 438/229
(58) Field of Search ..................................... 438/618, 585, 438/299–307, 229–233

(56) References Cited

U.S. PATENT DOCUMENTS

| | | | |
|---|---|---|---|
| 5,376,578 | * 12/1994 | Hsu | 438/289 |
| 5,940,710 | * 8/1999 | Chung et al. | 438/305 |
| 6,087,727 | * 7/2000 | Tsutsumi | 257/754 |

* cited by examiner

Primary Examiner—Charles Bowers
Assistant Examiner—Thanh Nguyen
(74) Attorney, Agent, or Firm—Foley & Lardner

(57) ABSTRACT

A method for fabricating a field effect transistor (FET) in and on a semiconductor substrate with local interconnects to permit the formation of minimal space between gate and the local interconnects by fabricating the source and drain of the FET and the local interconnects prior to forming the gate of the FET.

22 Claims, 10 Drawing Sheets

MINIMIZING TRANSISTOR SIZE IN INTEGRATED CIRCUITS

CROSS REFERENCED APPLICATION

The present application is a continuation-in-part application of U.S. application Ser. No. 09/119,934 filed on Jul. 21, 1998 now U.S. Pat. No. 6,146,954 by Klein, et al.

FIELD OF THE INVENTION

The present invention relates to integrated circuits (ICs) or semiconductor chips and a method of fabricating ICs. More specifically, the present invention relates to transistors, such as, field effect transistors, with reduced spacing between gates and local interconnects and a method of fabricating such transistors.

BACKGROUND OF THE INVENTION

Certain integrated circuits (ICs) and IC fabrication processes utilize local interconnects to electrically couple transistor elements. Local interconnects can connect a drain, source, or gate of one transistor to a drain, source, or gate of another transistor. Additionally, local interconnects can connect the drain, source, or gate of one transistor to the drain, source, or gate of the same transistor or to other circuits or conductors within the IC. Generally, conventional local interconnects are formed below a first aluminum (Al) or metal layer associated with an IC (e.g., at the same level or below the top surface of a first thick insulating layer over the semiconductor substrate).

Local interconnects can be created in a trench etch and fill process before the first metal layer is provided over the first thick insulating layer. Local interconnects are generally formed after transistors are formed on the semiconductor substrate and covered by the first thick insulating layer. The thick insulating layer is etched to form trenches which connect the various circuit and transistor elements in accordance with the particular design of the IC. The trenches are filled with a conductive material, such as, polysilicon, tungsten, or other metal to complete the local interconnect. In this way, connection s between transistors, nodes, and other elements can be achieved locally without using the first metal layer.

With the demand for higher levels of integration in semiconductor chips, such as silicon semiconductor chips, and the need for greater density in the circuits on the chips, the spacing between the gates of field effect transistors (FET) when forming local interconnects to the source and drain of the FET becomes more is and more critical. This is especially the case with a microprocessor IC or chip of which a large portion of the real estate of the chip is a static random access memory (SRAM). For increased performance of future microprocessors, the storage capacity of the SRAM must increase, thereby requiring a larger portion of real estate of the microprocessor.

Since the FET is fabricated prior to the formation of the local interconnects, conventional processes include a lithographic mask design which provides for additional space between local interconnect openings and the polysilicon gate to prevent accidental shorting of the source and/or drain to the gate across the local interconnect. This additional space in the layout or mask design wastes valuable real estate of the silicon wafer. Therefore, it would be desirable to create minimum spaced local interconnects without regard to the presence of the gate of the FET in the spaces between the local interconnects.

SUMMARY OF THE INVENTION

Accordingly, it is an object of the present invention to provide a method of fabricating an integrated circuit (IC) with minimal spacing between gates of FETs and the local interconnects.

Another object of present invention is to provide an integrated circuit fabrication method in which the local interconnect can be fabricated without regard to the presence of the gates of the FETs in the spaces between the local interconnects.

Yet another object of the present invention is to provide an IC structure, wherein the gate conductor and the insulative spacers (combined) preferably have a width of one lithographic feature.

A further object of the present invention is to provide an integrated circuit fabrication method in which the fabrication of the local interconnects controls the fabrication spacing of the gate.

In accordance with the present invention, an integrated circuit semiconductor substrate is fabricated by first forming the local interconnects to the source and drain of an FET prior to the formation of the gate. The fabrication method comprising the steps of: forming on a semiconductor substrate a thick insulating layer; forming spaced apart openings in the insulating layer for creating a source and drain; filling each of said openings with a conductive material to form local interconnects; removing the portion of the insulating layer between the local interconnects to form an opening; forming a gate oxide on the semiconductor substrate in the opening; and forming a gate electrode on the gate oxide and between the local interconnects. Preferably, an etch protective or stop layer is formed on the semiconductor substrate before forming the thick insulating layer.

Optionally, a P-type local interconnect mask and N-type local interconnect mask are utilized to form the local interconnect openings, thereby eliminating the need for separate P-type and N-type doping masks. In addition, the conductive material for forming the local interconnects can be the origin of impurities for the source and drain or, preferably, the impurities can be implanted by using the insulating layer as mask for self aligning the implantation. Further, an insulating space is created between the local interconnects and the gate. The space between the pair of local interconnects can be as small as one minimum lithographic feature and the local interconnects can each be as small as one minimum lithographic feature in size so the FET is not greater than three minimum lithographic features.

In accordance with the present invention, an integrated circuit includes a transistor. The integrated circuit includes a pair of local interconnects spaced from each other by as little as a minimum lithograph feature and each local interconnect which can be as small as a minimum lithograph feature in size, and a gate disposed in the space between the local interconnects. The gate is separated from the local interconnects by an insulating liner. One dimension of the transistor can be as small as three lithographic features.

In accordance with yet another exemplary embodiment of the present invention, an integrated circuit includes a transistor. The integrated circuit includes a pair of local interconnects and a gate disposed between the local interconnects. The gate is separated from the local interconnects by an insulating liner.

In accordance with yet another exemplary aspect of the present invention, a reduced gate critical dimension can be achieved. Additionally, the method of the present invention can eliminate the need for silicidation or salicidation steps.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF THE PREFERRED EMBODIMENTS OF THE INVENTION

Figure 1:
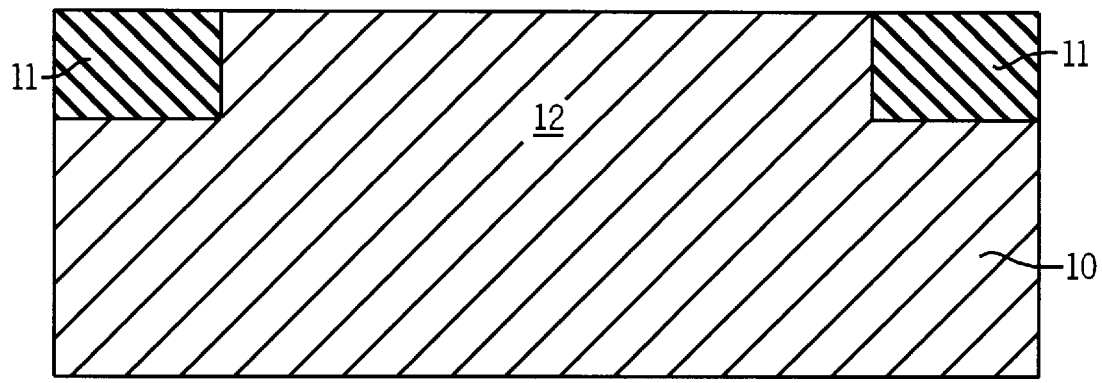
FIG. 1 is a cross-sectional view of a portion of a semiconductor substrate with field areas spaced from each other and having an active region therebetween.

Referring now to the drawings of FIGS. 1–15B, FIG. 1 shows a cross-sectional view of a portion of a semiconductor wafer including a semiconductor substrate 10 (e.g., silicon) having field isolation regions 11, herein shallow trenches, formed in the substrate on opposite sides of an active area 12 on and in which a field effect transistor (FET) is to be formed. Prior to forming the FET, a thick insulating layer 13a is deposited on the semiconductor substrate 10.

Figure 2A:
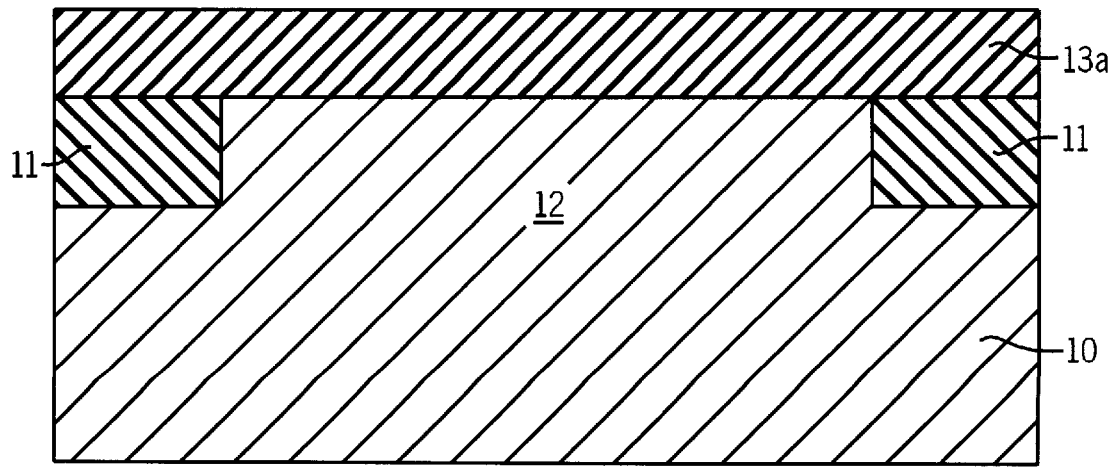
FIG. 2A is a cross-sectional view of the portion of the semiconductor substrate of FIG. 1 showing a thick insulating layer on the substrate.
Figure 2B:
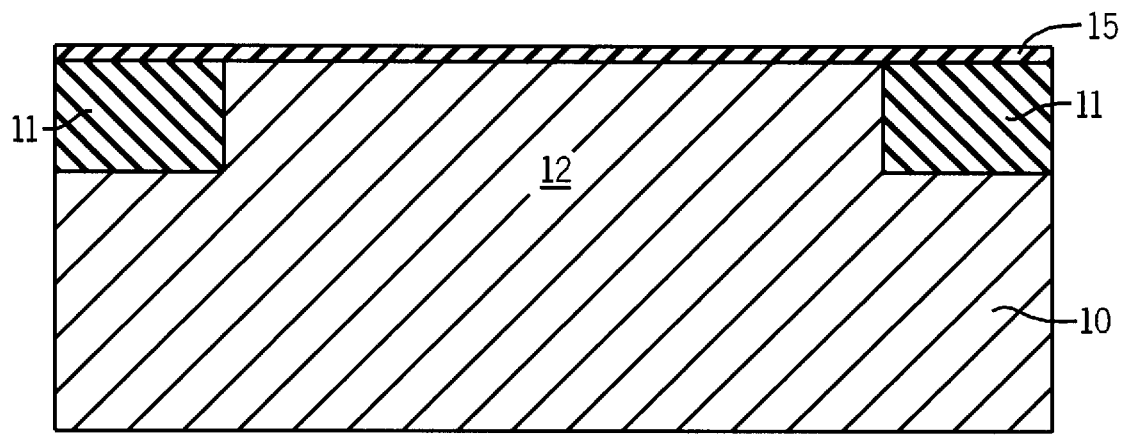
FIG. 2B is a cross-sectional view of the portion of the semiconductor substrate of FIG. 1 showing an etch protective or stop layer on the substrate.
Figure 3:
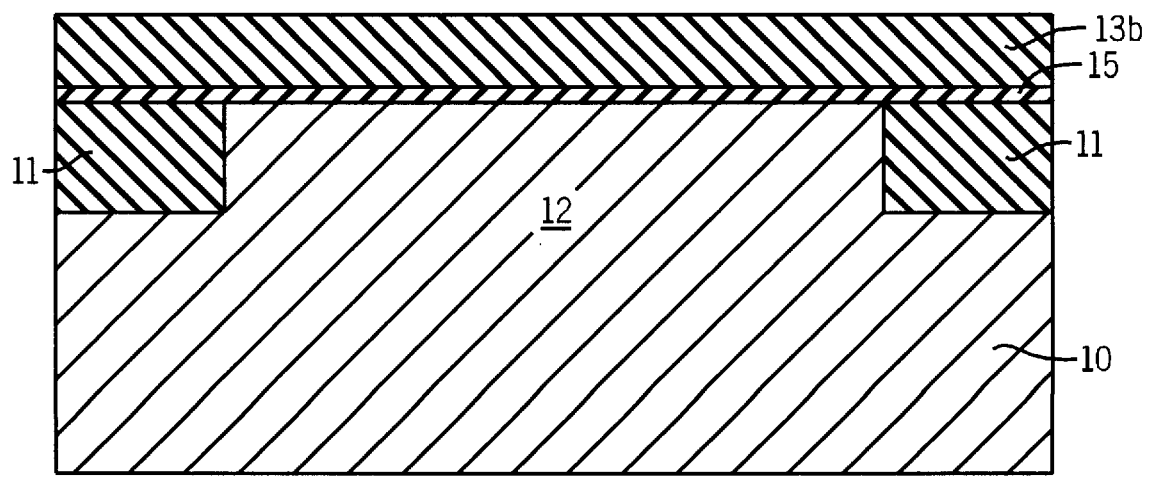
FIG. 3 is a cross-sectional view of the portion of the semiconductor substrate of FIG. 2B with a thick insulating layer on the etch protective or stop layer.
Figure 4:
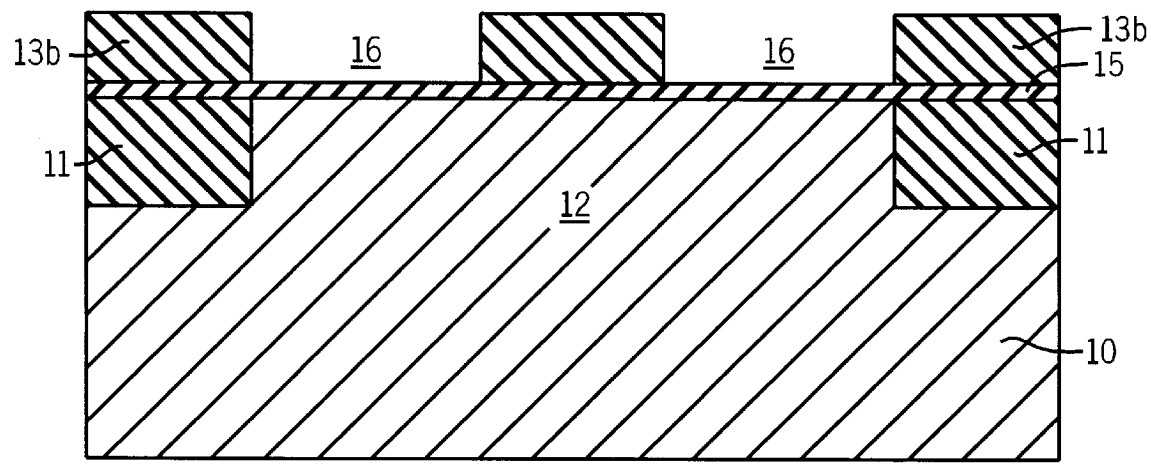
FIG. 4 is a cross-sectional view of the portion of the semiconductor substrate of FIG. 3 with openings for local interconnects in the insulating layer.
Figure 5:
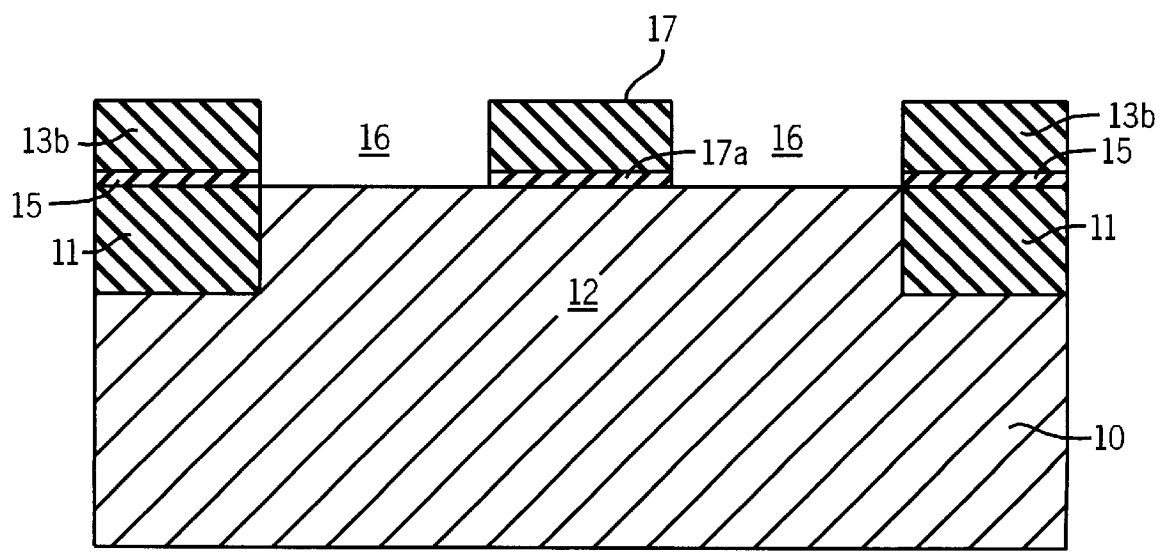
FIG. 5 is a cross-sectional view of the portion of the semiconductor substrate of FIG. 4 with openings for the local interconnects in the etch protective or stop layer.

Preferably, an etch protective or stop layer 15 is deposited on substrate 10 as shown in FIG. 2B before depositing thick insulating layer 13b as shown in FIG. 3. The etch selectivity properties of etch stop layer 15 are different from the etch selectivity of a thick insulating layer 13b. After layers 13b and 15 are formed by deposition, a mask pattern (not shown) is used to remove portions of layers 13b and 15 to form openings 16 (FIG. 4) by etching with a first etchant which is more selective for layer 13b than for layer 15 so that the etching stops upon reaching layer 15. A second etchant, which is more selective for layer 15 than for both layer 13b and silicon substrate 10, is then used so that the etching stops upon reaching the substrate 10. Openings 16 are preferably one minimum lithographic feature wide and can be separated from each other by as little as one minimum lithographic feature. Portions 17 and 17a (FIG. 5) of insulating layer 13b and etch stop layer 15, respectively, remain over active region 12 after forming openings 16.

Figure 6:
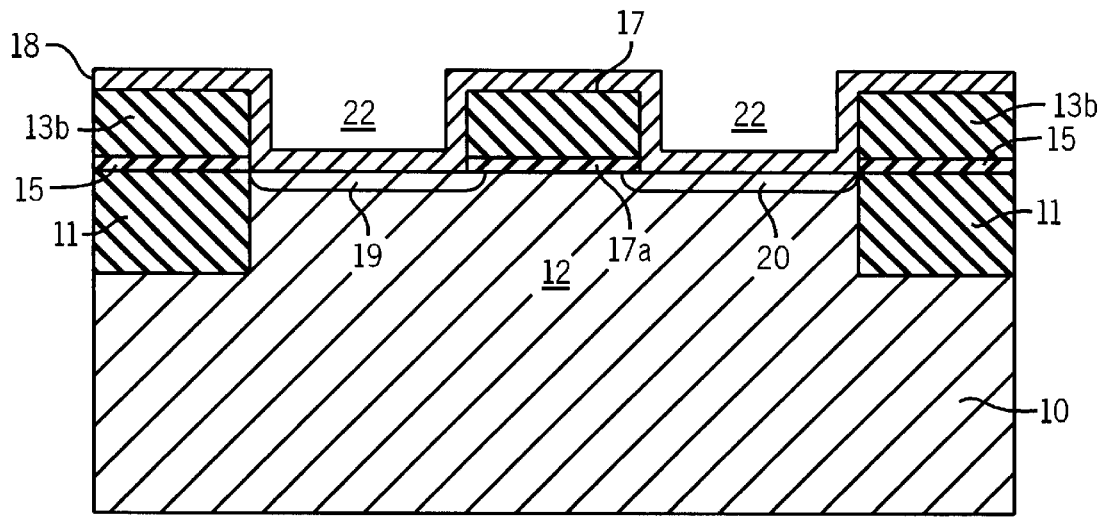
FIG. 6 is a cross-sectional view of the portion of the semiconductor substrate of FIG. 5 with a source, a drain, and conformal conductive layer deposited on the insulating layer and in the openings.

According to one alternative embodiment, to form a source and a drain, a conformal conductive layer 18 (FIG. 6) is deposited on layer 13b and in openings 16. Layer 18 is preferably doped polysilicon. By outdiffusing the impurities into substrate 10, a source 19 and a drain 20 are formed as shown in FIG. 6.

Figure 7A:
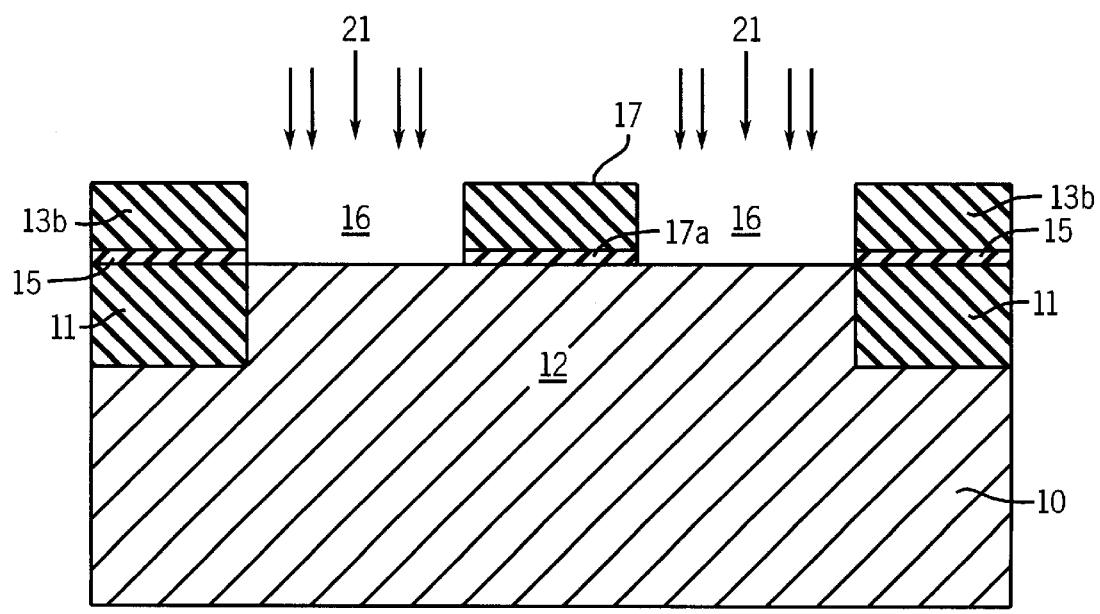
FIG. 7A is a cross-sectional view of the portion of the semiconductor substrate of FIG. 5 showing implantation of impurities for creating a source and a drain.

According to a preferred embodiment, impurities are implanted to form source 19 and drain 20 as shown by arrows 21 using portion 17 of insulating layer 13b as a mask to form source 19 and drain 20 before depositing conformal layer 18a as shown in FIG. 7A. Implantation can also be performed at an angle which is not normal to the top surface of substrate 10 to place impurities partially underneath portion 17a.

Generally, N-type and P-type channel masks are utilized to implant impurities in substrate 12. Optionally, openings 16 are formed over N-channel areas only and doped with an N-type dopant. Next, openings 16 are formed over P-channel areas only and doped with P-type dopants.

In this optional embodiment, a photolithographic mask defines openings 16 in N-channel areas. Openings 16 are formed and N-type dopants are provided through the mask to form source 19 and drain 20 in N-channel areas. The mask can be stripped after the formation of openings 16 and before N-type dopants are provided. Next, a photolithographic mask covers openings 16 in the N-channel areas and defines openings 16 in P-channel areas. Opening 16 are formed in the P-channel areas and P-type dopants are provided through the mask to form source 19 and drain 20 in the P-channel regions. The mask for the P-channel areas is not stripped before the P-type dopants are provided because the mask covers openings 16 in the N-channel areas. With such a scheme, only two masks (instead of three masks) are required to form openings 16, and to dope source 19 and drain 20. (One mask for P-type transistors on substrate 10 and one mask for N-type transistors on substrate 10; compared to one mask for openings 16, one mask for P-type doping, and one mask for N-type doping).

Figure 7B:
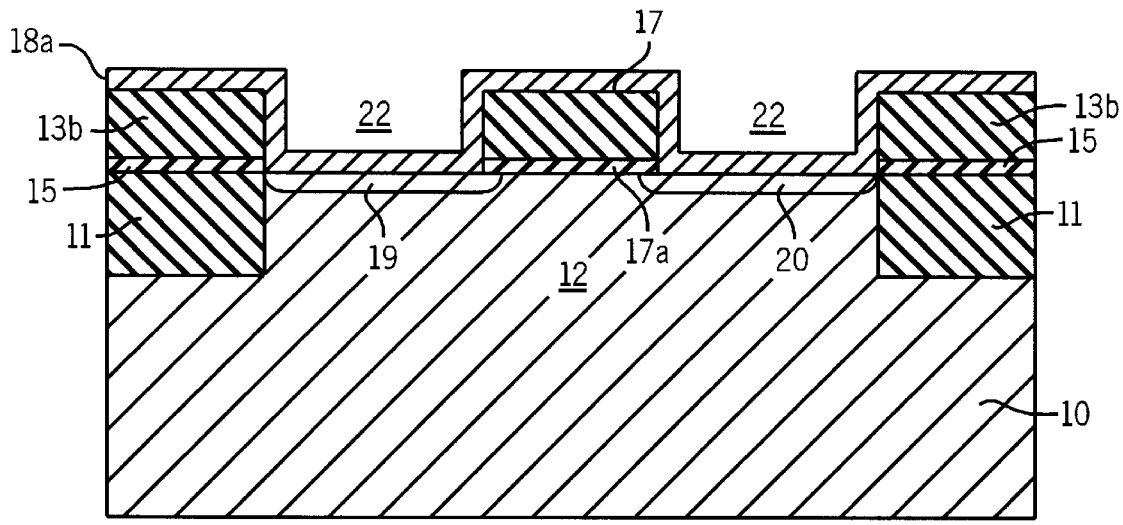
FIG. 7B is a cross-sectional view of the portion of the semiconductor substrate of FIG. 7A showing the implanted impurities annealed and a conformal conductive layer deposited on the insulating layer and in the openings.
Figure 8:
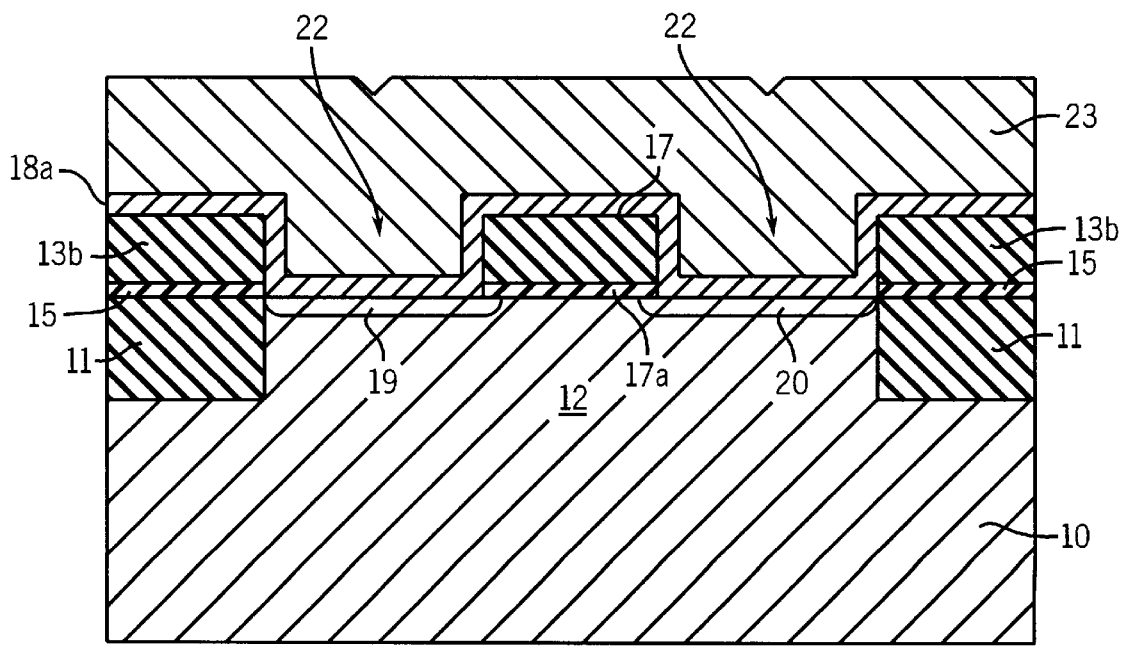
FIG. 8 is a cross-sectional view of the portion of the semiconductor substrate of either FIG. 6 or FIG. 7B with a conductive material deposited on the conformal layer and filling the openings.
Figure 9A:
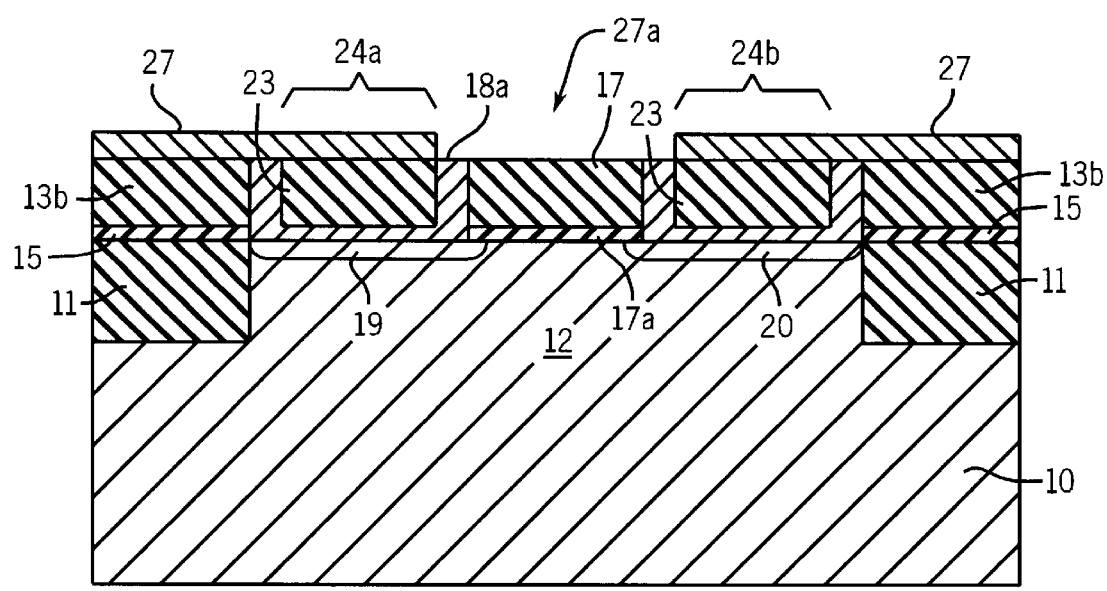
FIG. 9A is a cross-sectional view of the portion of the semiconductor substrate of FIG. 8 with the conductive material and the conformal layer planarized and including a patterned photoresist layer.

After implantation and before conformal conductive layer 18a (FIG. 7B) is deposited, substrate 10 is annealed using a rapid thermal anneal (RTA) to activate and diffuse the impurities as shown in FIG. 7B. To completely fill the remaining openings 22 for the local interconnects, another conductive material 23 is deposited in remaining openings 22 as shown in FIG. 8. Conductive material 23 and layer 18a are planarized so as to be level with insulating layer 13b and portion 17 (as shown in FIG. 9A) to form local interconnects 24a and 24b.

Figure 9B:
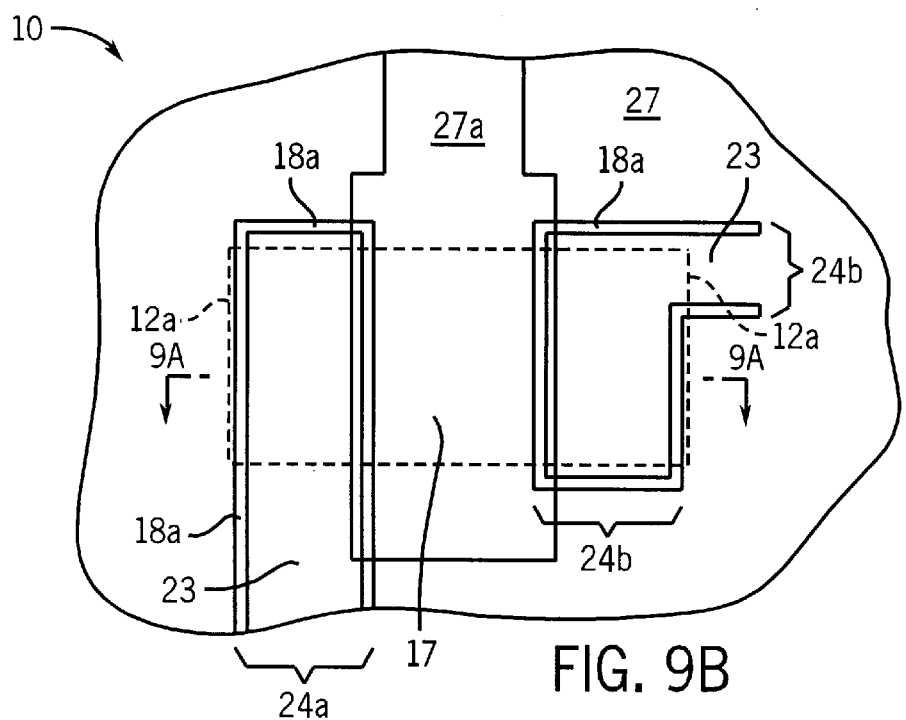
FIG. 9B is a top view of the portion of the semiconductor substrate of FIG. 9A.

After planarization, a photoresist layer 27 is deposited and selectively patterned. Area 27a is an absence of photoresist layer 27 as shown in FIG. 9A. Layer 27 does not cover portion 17, as well as portions of interconnects 24a and 24b. In FIG. 9B, the active region or area 12 associated with substrate 10 as viewed from the top is outlined by a dotted line 12a. Absence 27a allows portions of interconnects 24a and 24b (material 23 and layer 18a) and portion 17 to be exposed. In FIG. 9B, local interconnects 24a and 24b are shown even though interconnects 24a and 24b are at least partially covered by layer 27.

Figure 10:
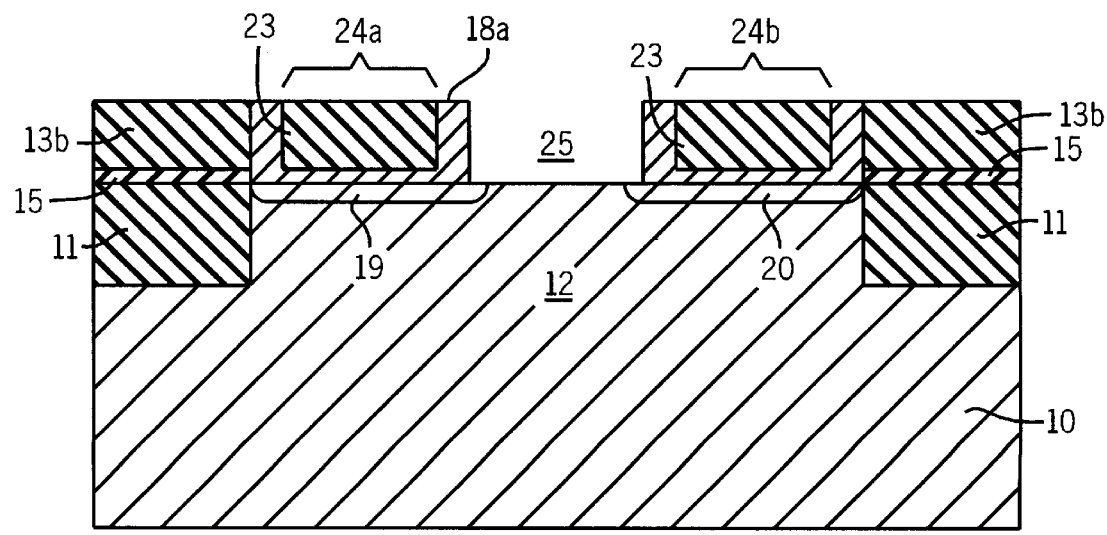
FIG. 10 is a cross-sectional view of the portion of the semiconductor substrate of FIG. 9A with the thick insulating layer in a gate region removed leaving a gate region opening.
Figure 11:
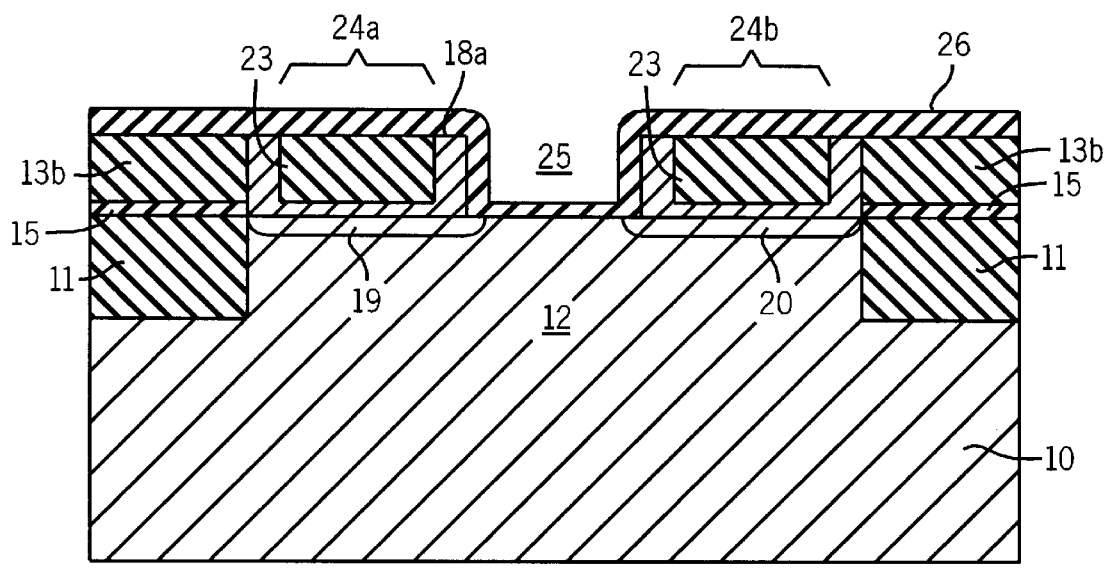
FIG. 11 is a cross-sectional view of the portion of the semiconductor substrate of FIG. 10 with a conformal insulating layer deposited in the gate region opening and over the top surface of the thick insulating layer.
Figure 12:
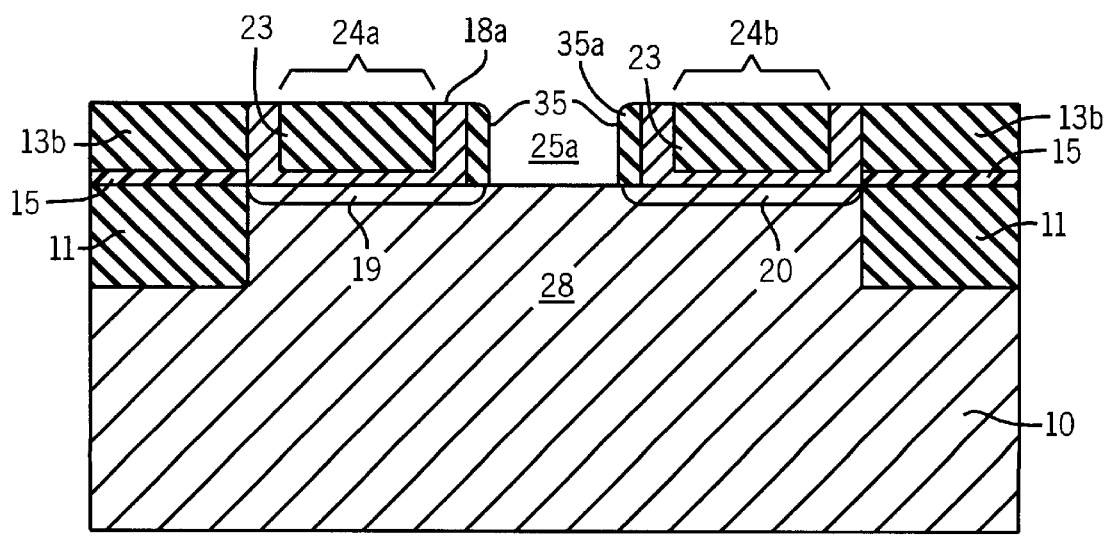
FIG. 12 is a cross-sectional view of the portion of the semiconductor substrate of FIG. 11 with the conformal insulating layer anisotropically etched to form sidewalls in the gate region opening.
Figure 13:
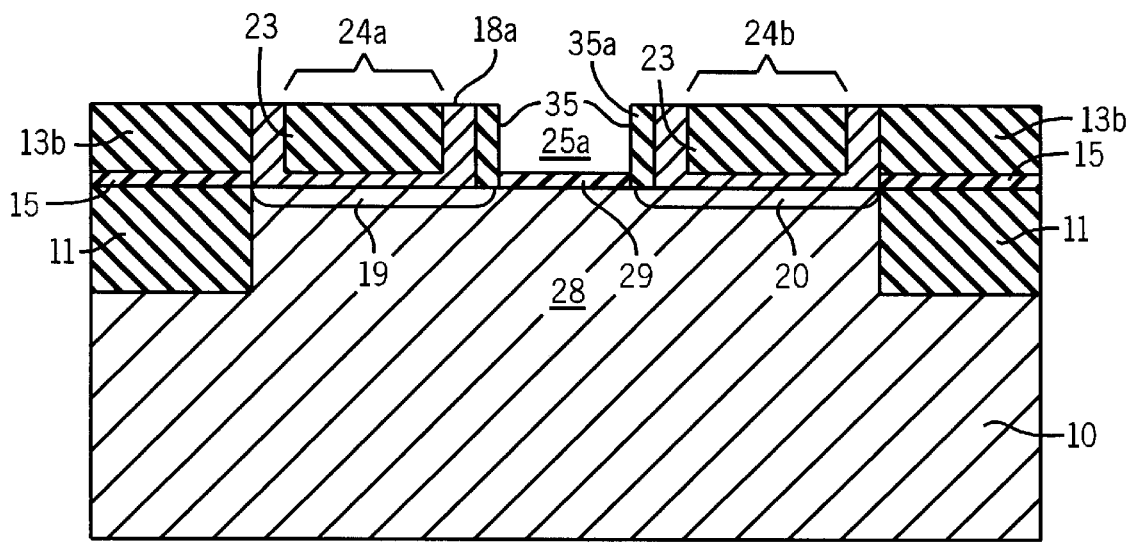
FIG. 13 is a cross-sectional view of the portion of the semiconductor substrate of FIG. 12 with a gate dielectric provided on the surface of the semiconductor substrate in the gate region.

In FIG. 10, portions 17 and 17a are removed to form opening 25. Layer 17 and etch stop layer 17a can be removed by anisotropic etching. Now, a thin insulating layer 26 from a conformal source is deposited within the opening 25 and over the top surface of interconnects 24a and 24b and layer 13b as shown in FIG. 11. After deposition of layer 26, layer 26 is anisotropically etched to remove layer 26 from the bottom of opening 25, top surface of interconnects 24 and 24b, and from layer 13b. Insulating sidewalls 35 remain abutting local interconnects 24a and 24b, sidewalls 35 being separated by an opening 25a over an area 28, area 28 being the channel region of the FET as shown in FIG. 12. Sidewalls 35 can have rounded corners 35a. With substrate 10 now exposed at the bottom of opening 25, a gate dielectric layer 29 is thermally grown or deposited on the bottom of opening 25a as shown in FIG. 13. Layer 29 can be any type of gate dielectric material.

Figure 14:
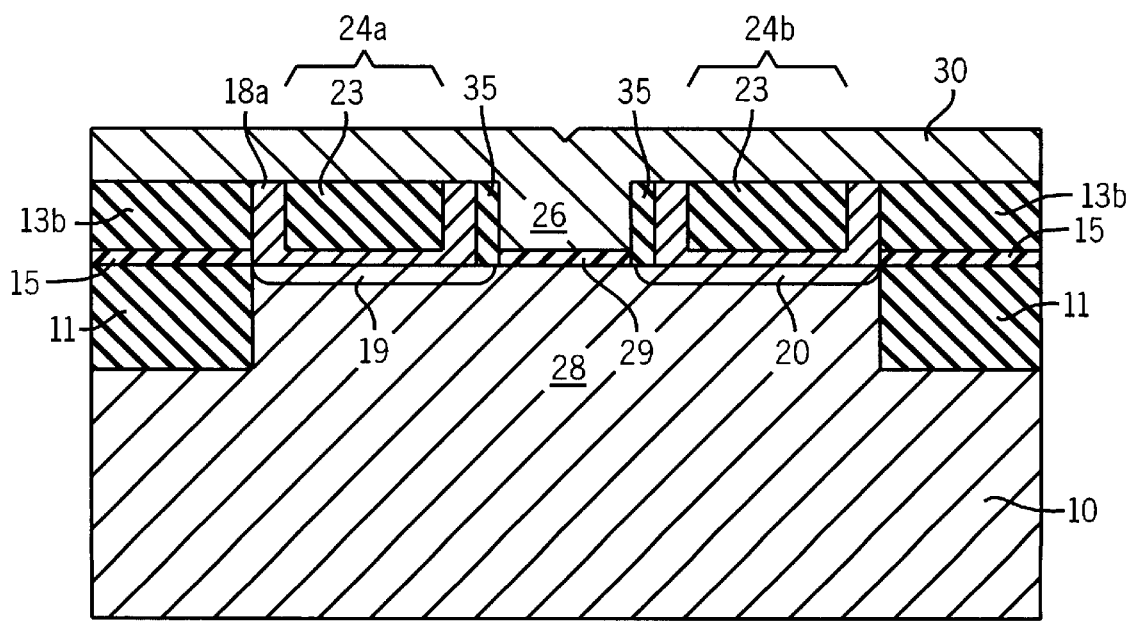
FIG. 14 is a cross-sectional view of the portion of the semiconductor substrate of FIG. 13 with a conductive material deposited in the gate region opening over the gate dielectric and over the top surface of the thick insulating layer.

Since source 19, drain 20 and gate dielectric layer 29 are now fabricated, only fabrication of a gate electrode remains to complete the FET. A gate material 30 is deposited to a thickness to substantially fill opening 25a, as shown in FIG. 14, in opening 25a and on gate dielectric layer 29. The surface of gate material 30 is planarized to a level below the levels of local interconnects 24a and 24b and insulating layers 13a and 13b, depending on the embodiment, to complete the FET with a gate electrode 31 (FIG. 15A). Preferably, material 30 and interconnects 24a and 24b are planarized at least until corners 35a are removed from sidewalls 35.

Figure 15B:
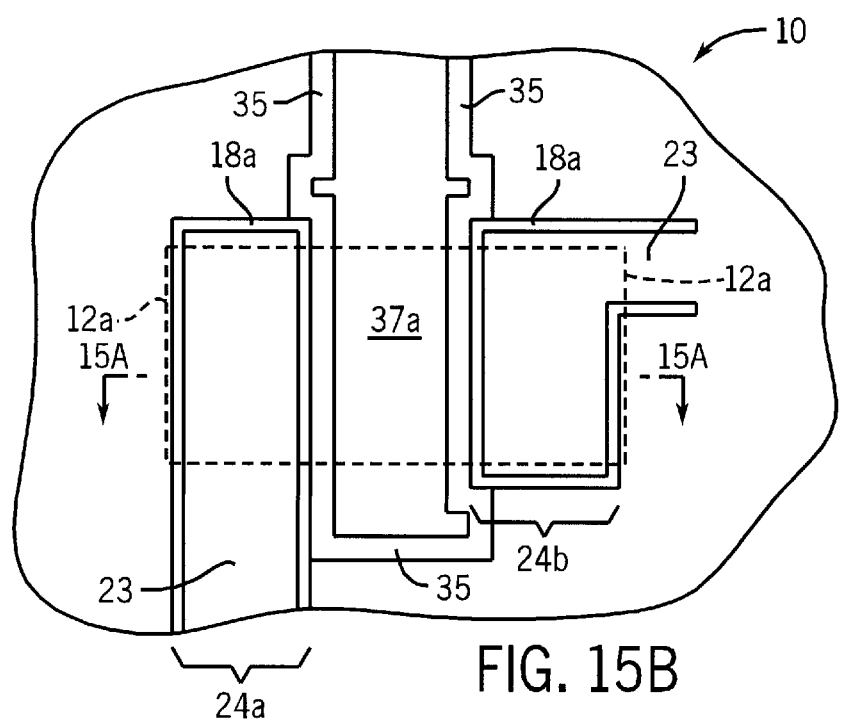
FIG. 15B is a top view of the portion of the semiconductor substrate of FIG. 15A.
Figure 15A:
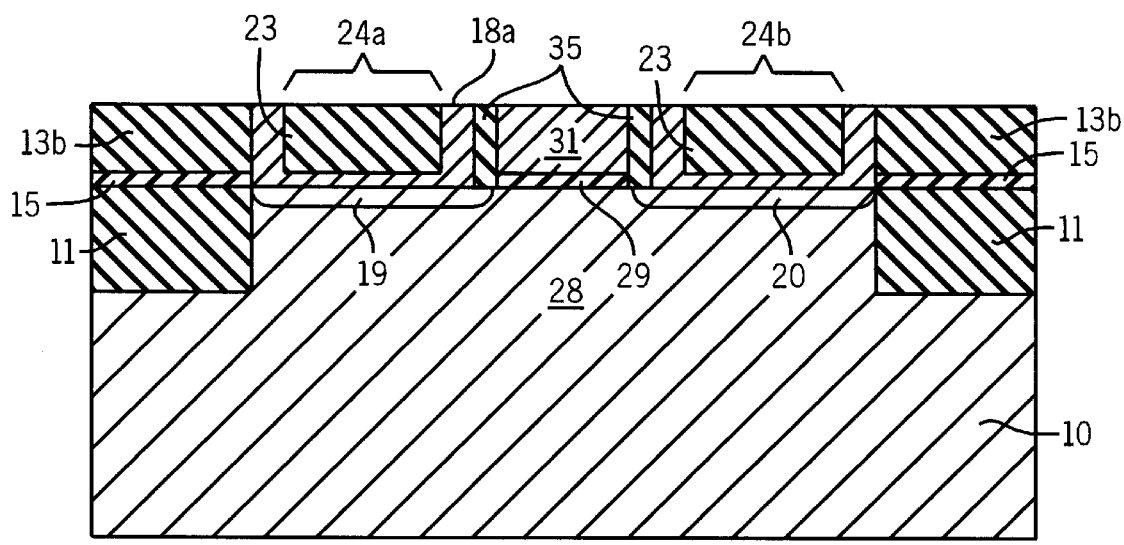
FIG. 15A is a cross-sectional view of the portion of the semiconductor substrate of FIG. 14 with the conductive material planarized.

In FIG. 15B, a top view shows active region 12 outlined by dotted line 12a. The FET has a dimension of as little as three lithographic features from a left side of interconnect 24a to a right side of interconnect 24b.

To achieve a minimal size transistor, the desired lithographic pattern size is established and defined as a minimum feature. The spacing between openings 16 for source 19 and drain 20 is one minimum feature and openings 16 are each one minimum feature in size so the transistor is three minimum features in one dimension. For example, if the desired minimum lithographic feature size is 0.25 $\mu$m, the size (dimension from and including drain 19 to and including source 20) of the transistor would be 0.75 $\mu$m. The described structure and method also provides for a small gate critical dimension. For example, the gate electrode 31 can be smaller than the minimal lithographic feature (see FIG. 15A).

To supplement the above general description of the present invention, a detailed description of the steps of the present invention will now be given. As shown in FIG. 1, silicon substrate 10 with a {100} plane orientation is doped with an appropriate impurity depending on whether the FETs are to be N-type or P-type.

If the FETs are to be complementary N-type and P-type, such as a complementary metal oxide silicon (CMOS) FET, selected portions of substrate 10 will be doped with an appropriate impurity to form wells in the complementary areas. To simplify the description of the present invention, the embodiment of the integrated circuit is an N-type FET and substrate 10 is doped with a P-type impurity, herein boron (B). Field isolation regions 11 are formed on both sides of an active region 12 for the transistor. Herein, field isolation region 11 are shallow trenches fabricated by etching a groove in the silicon substrate followed by depositing silicon dioxide in the groove and planarizing the surface of the substrate, using a chemical/mechanical polish (CMP) step. A protective layer of silicon nitride (not shown) can also be incorporated on top of active region 12 as a stop layer for the CMP step. If desired, the walls of the groove in the silicon substrate can be thermally oxidized to form a high quality oxide liner on the walls of the groove before depositing the silicon dioxide. The preferred method of deposition is low pressure chemical vapor deposition (LPCVD) with tetraethylorthosilicate (TEOS) as the source at a temperature of 650 to 750° C.

Prior to forming the FET in the active region 12, herein an N-type FET, a thick insulating layer 13a is deposited on semiconductor substrate 10 as shown in FIG. 2A. Preferably, the material of thick insulating layer 13a is silicon dioxide ($SiO_2$) and ranges in thickness from 2,000 A to 10,000 A, herein 6,000 A. Layer 13a is deposited using chemical vapor deposition (CVD) of silane ($SiH_4$) and oxygen ($O_2$) at 650–750° C. and is optionally planarized using chem/mech polishing with a commercial slurry. Preferably, an etch protective or stop layer 15 is deposited on the substrate 10 as shown in FIG. 2B before thick insulating layer 13b is deposited as shown in FIG. 3. Herein, the etch stop layer 15 is silicon nitride ($Si_3N_4$ or SiN) or, alternatively, silicon oxynitride ($SiO_xN_4$) in the range of 500 A to 2,000 A, herein 1,000 A, and is LPCVD deposited using dichlorosilane ($SiCl_2H_2$) and ammonia ($NH_3$) at 700–800°. The etch selectivity properties of the etch stop layer 15 are different from the etch selectivity of the insulating layer 13b, which is deposited in the same manner and of the same thickness as layer 13a. Layer 13b is optionally planarized using chem/mech polishing with a commercial slurry.

After layers 13b and 15 are formed, a photolithographic mask pattern (not shown) is used to create openings 16 by removing portions of layers 13b and 15 by first etching with an etchant more selective for layer 13b than for layer 15. Herein, openings 16 are formed by anisotropically etching the silicon dioxide of layer 13b in a parallel plate reactive ion etcher with a plasma gas of silicon tetrafluoride ($SiF_4$) and hydrogen ($H_2$), which is more selective for the silicon dioxide of layer 13b than the silicon nitride of etch stop layer 15 so that the etching stops or substantially slows upon reaching layer 15. Using the same reactor but with a plasma gas of silicon tetrafluoride and oxygen, which is more selective for silicon nitride than silicon dioxide and silicon, etch stop layer 15 is removed to complete openings 16. The etching stops or substantially slows at the surface of silicon substrate 10 leaving portion 17 of layer 13b and portion 17a of layer 15 over the active region 12.

One method of forming a source and a drain is to use a conformal conductive layer 18, herein polysilicon, doped with impurities of arsenic (As). Layer 18 is deposited on layers 13b and in openings 16 and, by outdiffusing the arsenic impurities into the substrate, source 19 and drain 20 are formed as shown in FIG. 6. The doped polysilicon is deposited in situ using silane ($SiH_4$) and arsine ($AsH_3$). For CMOS processes, the polysilicon can be doped using ion implantation through separate N and P-mask layers.

Preferably, to form source 19 and drain 20, impurities, herein arsenic, as shown by arrows 21, are implanted using portion 17 of insulating layer 13b as an alignment mask before depositing a conformal barrier layer 18a as shown in FIG. 7A. After implantation, the substrate is annealed using rapid thermal anneal (RTA) to activate and diffuse the impurities. The substantially conformal barrier layer 18a of about 200 A–500 A in thickness is deposited by PVD or CVD.

Layer 18a now lines the walls and bottom of opening 16 and leaves remaining openings 22 as shown in FIG. 7B. To completely fill remaining openings 22 for the local interconnects, another conductive material 23 is deposited in openings 22, such as tungsten (W), as shown in FIG. 8, which is LPCVD deposited from tungsten hexafluoride ($WF_6$) with hydrogen at a temperature approximately 400° C. After the deposition of conductive material 23 (e.g., tungsten), material 23 and layer 18a on the surface of insulating layer 13b are removed by planarization using chem/mech polishing with a commercial slurry, as shown in FIG. 9A, to form local interconnects 24a and 24b coupled to source 19 and drain 20, respectively, and separated by portions 17 and 17a.

Next, as shown in FIG. 9A, portion 17 and portion 17a are removed to form opening 25 by masking all but portion 17 and a small portion of local interconnects 24a and 24b with a layer 27, such as, photolithographic resin and anisotropically etching the silicon dioxide of the portion 17 (layer 13b) in a parallel plate reactive ion reactor with a plasma gas of silicon tetrafluoride and hydrogen, which is more selective for silicon dioxide of portion 17 than barrier layer 18a and material 23 of the local interconnects. Without removing the resist mask, portion 17a of the etch stop layer 15 is removed using a gas mixture of silicon tetrafluoride and oxygen. Now, a thin insulating layer 26 from a conformal source is deposited over the top surface of substrate 10 and within and on the walls of opening 25 as shown in FIG. 11. Herein, insulating layer 26 is silicon dioxide and is deposited by LPCVD using TEOS at a temperature in the range of 650 to 750° C. The thickness of layer 26 is about 500 A. Alternatively, layer 26 can be other types of insulating materials.

After deposition of layer 26, layer 26 is anisotropically etched, using similar reactor and gas to that used to remove portions 17. The horizontal portions of layer 26, are removed from opening 25 and from above local interconnects 24a and 24b, thereby leaving insulating sidewalls 35 abutting local interconnects 24a and 24b. Sidewalls 35 are separated by an opening 25a over area 28 which will become the channel region of the FET as shown in FIG. 12. Sidewalls 35 will act as spacers for a gate electrode 31 and insulate electrode 31 from interconnects 24a and 24b. With silicon substrate 10 now exposed at the bottom of the opening 25a, a gate dielectric layer 29 is thermally grown or deposited on the bottom of opening 25a as shown in FIG. 13.

Since source 19, drain 20 and gate dielectric layer 29 are now fabricated, only a gate electrode remains to complete the N-type FET. Metal or doped polysilicon gate material is deposited, as shown in FIG. 14, in opening 25a and on gate dielectric layer 29. To planarize the surface, gate material 30 is chem/mech polished using a commercial slurry, to a level below the original surface of local interconnects 24a and 24b and insulating layers 13a or 13b in FIG. 15A to remove corners 35a, depending on the embodiment. Removing corners 35a reduces the occurrence of shorting between gate 31 and interconnects 24a and 24b. To finish the fabrication of an integrated circuit with the FET of FIG. 15, multilevel conductive lines and vias (not shown) separated by insulating layers (not shown) are used to connect local interconnects 24a and 24b and gate 31 with other FETs and passive components of the integrated circuit as is well known in the art and will not be described here.

Although this invention has been described relative to specific materials, and apparatuses for depositing and etching these materials, it is not limited to the specific materials or apparatuses but only to their specific characteristics. Other materials and apparatuses can be substituted for those described herein which will be well understood by those skilled in the microelectronics and semiconductor arts after appreciating the present invention.

Having thus described the invention, what is claimed is:

1. A method of fabricating at least a pair of local interconnects with one interconnect on each side of a gate of a field effect transistor (FET) in an integrated circuit on a semiconductor substrate comprising the steps of:

forming on a semiconductor substrate a thick insulating layer;

forming at least a pair of spaced apart openings in the insulating layer adjacent the semiconductor substrate;

forming a source in one of the openings and a drain in the other of the openings;

filling each of the openings with a conductive material to form local interconnects to the source and drain;

removing a portion of the insulating layer to form a gate opening between the local interconnects;

forming a gate dielectric on the semiconductor substrate in the gate opening; and forming a gate on the gate dielectric in the gate opening between the local interconnects.

2. The method of claim 1, wherein the space between the pair of openings is one minimum photolithographic feature and the local interconnects are each one minimum photolithographic feature.

3. The method of claim 1, wherein insulating spacers are each disposed on an interconnect wall adjacent the gate to separate each of the local interconnects from the gate.

4. The method of claim 1, wherein the source and drain are formed by implanting impurities in the pair of openings in the insulating layer.

5. The method of claim 1, wherein the portion of insulating layer removed to form the gate opening is removed by using a masking material with an opening in the masking material positioned between the pair of local interconnects.

6. The method of claim 5, wherein the opening in the masking material extends over but not beyond each of the pair of local interconnects.

7. The method of claim 6, wherein the opening in the masking material is positioned over an active region in the semiconductor substrate, the active region being surrounded by an isolation region, the opening in the masking material extending to or beyond the active region.

8. The method of claim 1, wherein a conductive layer is formed on walls of the to line the spaced apart openings and a remainder of the spaced apart openings are filled with another conductive material.

9. The method of claim 8, wherein the conductive layer is polysilicon and the another conductive material is tungsten.

10. The method of claim 9, wherein the polysilicon is the origin for the impurities for the source and drain.

11. The method of claim 1, wherein a barrier layer is formed on the walls of the spaced apart openings to line the opening and a remainder of the local interconnect opening is filled with a conductive material.

12. The method of claim 11, wherein the barrier layer includes titanium nitride.

13. The method of claim 1, wherein an insulating etch stop layer is formed on semiconductor substrate before forming the thick insulating layer.

14. The method of claim 13, wherein the etch selectivity of the etch stop layer is different from the etch selectivity of the insulating layer.

15. The method of claim 14, wherein the etch stop layer is a nitride of silicon.

16. The method of claim 1, wherein the gate is selected from the group of polysilicon, refractory metal and metal.

17. A method of fabricating, on a semiconductor substrate a field effect transistor (FET) having a source, drain and gate and with one interconnect on each side of a gate of the FET, the method comprising the steps of:

forming on a semiconductor substrate a thick insulating layer;

forming a pair of spaced apart openings in the insulating layer adjacent the semiconductor substrate, each opening being the size of a minimum lithographic feature;

forming a source in one of the spaced apart openings and a drain in the other of the spaced apart openings;

filling each of the openings with a conductive material to form local interconnects to the source and drain;

removing a portion of the insulating layer to form a gate opening of a minimum lithographic feature between the local interconnects; and forming a gate in the gate opening between the local interconnects, whereby the size of the FET transistor is three minimum lithographic features.

18. The method of claim 17, wherein spaced apart openings in the insulating material are positioned over an active region in the semiconductor substrate, the active region being surrounded by an isolation region, and the spaed apart openings extending to or beyond the active region.

19. A method of fabricating an integrated circuit including at least one transistor, the integrated circuit including a pair of local interconnects spaced from each other by a minimum lithographic feature and each being a minimum lithographic feature, a gate of the transistor being disposed in the space between the local interconnects and separate from each of the local interconnects by an insulating liner, whereby the width of the transistor is not greater than three lithographic features, the method comprising:

forming on a semiconductor substrate a thick insulating layer;

forming a pair of spaced apart openings in the insulating layer, each opening being the size of the minimum lithographic feature;

forming a source in one of the spaced apart openings and a drain in the other of the spaced apart openings;

filling each of the spaced apart openings with a conductive material to form the local interconnects;

removing a portion of the insulating layer to form a gate opening between the local interconnects; and forming the gate in the gate opening between the local interconnects.

20. The method of claim 19, wherein the spaced apart openings are positioned over an active region in the semiconductor substrate, the active region being surrounded by an isolation region, the spaced apart openings extending to or beyond the active region.

21. A method of manufacturing an integrated circuit including at least one transistor, the transistor including a pair of local interconnects spaced from each other, and a gate of the transistor being disposed in the space between the local interconnects and separated from each of the local interconnects by an insulating liner, the method comprising:

forming on a semiconductor substrate a thick insulating layer;

forming at least a pair of spaced apart openings in the insulating layer adjacent the semiconductor substrate;

forming a source in one of the openings and a drain in the other of the openings;

filing each of the openings with a conductive material to form the local interconnects;

removing a portion of the insulating layer to form a gate opening between the local interconnects;

forming a gate dielectric on the semiconductor substrate in the gate opening; and forming a gate on the gate dielectric in the gate opening between the local interconnects.

22. The method of claim 21, wherein the pair of local interconnects are spaced from each other by a minimum lithographic feature.

* * * * *